United States Patent [19]

Sherstinsky et al.

[11] Patent Number: 5,421,401
[45] Date of Patent: Jun. 6, 1995

[54] COMPOUND CLAMP RING FOR SEMICONDUCTOR WAFERS

[75] Inventors: Semyon Sherstinsky, San Francisco; Mei Chang, Cupertino; Charles C. Harris, Los Gatos; Alan F. Morrison, San Jose; Virendra V. S. Rana, Los Gatos, all of Calif.; James F. Roberts, Austin, Tex.; Ashok K. Sinha, Palo Alto, Simon Tam, Militas, both of Calif.

[73] Assignee: Applied Materials, Inc., Santa Clara, Calif.

[21] Appl. No.: 187,231

[22] Filed: Jan. 25, 1994

[51] Int. Cl.6 .................. F28F 7/00; C23C 15/00
[52] U.S. Cl. .................. 165/80.2; 165/80.1; 118/728.1; 269/254 R; 269/903
[58] Field of Search .................. 165/80.1, 80.2; 118/724, 728, 725; 269/254 R, 903

[56] References Cited

U.S. PATENT DOCUMENTS

| | | | |
|---|---|---|---|
| 3,711,081 | 1/1973 | Cachon | 269/21 |
| 4,473,455 | 9/1984 | Dean et al. | 269/903 X |
| 4,915,367 | 4/1990 | Carossino | 269/254 R |
| 4,978,412 | 12/1990 | Aoki et al. | 118/728 X |
| 5,094,885 | 3/1992 | Selbrede | 118/728 X |
| 5,316,278 | 5/1994 | Sherstinsky et al. | 269/254 R |

FOREIGN PATENT DOCUMENTS 23102  1/1987  Japan .................. 118/728

Primary Examiner—John Rivell
Assistant Examiner—L. R. Leo
Attorney, Agent, or Firm—Michael A. Glenn

[57] ABSTRACT

A compound clamp ring secures a semiconductor wafer having a wafer flat portion to a wafer pedestal during wafer processing while maintaining a continuous seal between the wafer edges and the wafer pedestal to prevent leakage of coolant gases circulated at the backside of the wafer into the process environment. The clamp ring has an annular wafer clamp surface adapted to press a round portion of the wafer into sealing abutment with the wafer pedestal. A cavity formed in the clamp ring securely receives a comb-like array of resilient flexures that are adapted to apply a yieldable bias to the flat portion of the wafer to complete the seal between the wafer and the pedestal at the flat portion of the wafer; and encloses the flexures to shield the flexures from process gases.

8 Claims, 5 Drawing Sheets

COMPOUND CLAMP RING FOR SEMICONDUCTOR WAFERS

BACKGROUND OF THE INVENTION

1. Technical Field

The present invention relates to semiconductor wafer processing. More particularly, the present invention relates to securing a semiconductor wafer to a wafer pedestal during processing.

2. Description of the Prior Art

It is important to maintain a nearly constant temperature across the surface of a semiconductor wafer during wafer processing, for example during plasma etching in a reaction chamber. Temperature uniformity is a critical part of assuring process reproducibility, i.e. achieving consistent processing results, as shown by high device yields and low device defect densities. It is also important to avoid subjecting the wafer to excessive temperatures that could damage the delicate features of the devices formed on the wafer surface.

An inert gas, such as Helium or Argon, is commonly used during wafer processing as a thermal transfer medium in the gap that exists between the wafer backside and a wafer pedestal to which the wafer is clamped, to thereby take advantage of the large thermal mass of the pedestal relative to the wafer. In this way, a consistent and predictable temperature is maintained across the wafer surface during wafer processing, and the various process steps used to fabricate devices on the wafer surface may be carried out in a reliable fashion.

Two shapes of wafers are commonly used in the semiconductor industry: round wafers, and wafers having a flat peripheral portion. Round wafers are aligned during wafer processing by means of a small notch placed in the wafer edge, while wafers having a flat portion are aligned on the wafer flat portion.

When processing a round wafer, a conventional wafer clamping arrangement, such as is shown in FIG. 1, secures the wafer 10 to a wafer cooling pedestal 12 with an annular wafer clamping ring 11. The clamping ring is used to press the edge of the wafer into a continuous sealing abutment with upper surface of the wafer pedestal. A port 13 is provided to flow a supply of coolant gas 14, such as Helium, to the backside of the wafer to improve thermal transfer between the wafer and the pedestal, as discussed above.

It is well recognized in the industry that leakage of cooling gasses, such as Helium, into the process environment from the backside region of the wafer is detrimental to the fine chemical balance required for wafer processing. Morever, a poor seal between the wafer and the wafer pedestal also allows reactants in the process environment to penetrate the regions at the backside of the wafer, where they can contaminate and/or etch the wafer backside and the wafer pedestal.

The seal between the wafer edge and the pedestal created by application of clamping pressure to the wafer edges prevents leakage of excessive amounts of cooling gas from the backside of the wafer into the wafer process environment, thereby eliminating or significantly mitigating cooling gas interference with critical wafer processing parameters and chemistry, and also restricting the possibility of volatile process components reacting with the backside of the wafer and the wafer pedestal.

Leakage of cooling gas applied to the backside of a wafer into the process environment is a daunting problem when wafers having a flat portion are processed because a discontinuous seal is formed between the wafer pedestal and the edge of the wafer that creates a gas leak gate. That is, it is not possible to secure a wafer, such as the wafer 20 shown in FIG. 2, having a flat portion 24 to a wafer pedestal with a conventional clamp ring to form a continuous seal between the edges of the wafer and the pedestal that prevents an excessive flow of cooling gas into the process environment.

FIG. 3a is a side elevation view showing the exposed flat portion 24 of a semiconductor wafer 20 when the wafer is secured to a wafer pedestal 12 by a prior art wafer clamping ring 26. A gap 22 exists at the point where the flat portion of the wafer coincides with the pedestal surface that allows relatively unrestricted flow of cooling gas from the wafer backside into the process environment.

The clamp ring 26 may be used to apply clamping pressure over the wafer flat portion, as well as the round portion of the wafer. See, for example FIG. 3b, which is a section taken along line A—A of the clamping arrangement shown in FIG. 3a. In the figure, the wafer clamp 26 contacts both the round portion of the wafer at the wafer edge 25, and the flat portion of the wafer at the flat edge 24. The clamp contacts each portion of the wafer and presses the wafer edges into abutment with the wafer pedestal at discrete locations on the wafer pedestal having different radii, such that clamping pressure is not distributed evenly and continuously about the edge of the wafer. As a result, cooling gas leaks from the backside of the wafer into the process environment.

Thus, while prior art clamp rings, in combination with a conforming pedestal wafer clamping area, distribute adequate pressure evenly about the edges of a wafer to provide a continuous seal on round wafers, such clamping arrangement cannot satisfactorily seal the edges of a wafer having a flat portion.

It is known to seal the edges of a round wafer to a pedestal with an elastomeric seal to prevent coolant gas leakage. See, for example Studley et al, *Perimeter Wafer Seal*, U.S. Pat. No. 4,923,358 (12 Jun. 1990). Using an elastomeric seal in a process chamber is unsatisfactory because the elastomer generates particles that can contaminate the chamber and wafers processed in the chamber; it limits the possibility of plasma cleaning because the reactant gases used to accomplish such cleaning may react with the elastomer; and it prevents wafer processing at the higher temperatures typically encountered in a process environment, which range up to about 400° C., because the elastomers melt at high temperatures. Additionally, Studley et al requires the use of an elaborate mechanism to press the clamp ring to the pedestal. The clamping mechanism applies sufficient clamping pressure to the wafer when forcing the wafer into abutment with the pedestal that the wafer is stressed and may even be broken. A clamping ring adapted to secure a wafer having a flat portion to a wafer pedestal is disclosed in Sherstinsky et al, *Clamping Ring Apparatus For Processing Semiconductor Wafers*, U.S. patent application Ser. No. 07/947,212 (filed 18 Sep. 1992 and commonly assigned to Applied Materials, Inc.) now U.S. Pat. No. 5,316,278. The disclosed clamping ring provides a plurality of yieldable metallic fingers that project radially inwardly, and that are spaced circumferentially about the clamp ring, to compensate for any discrepancy in wafer height and/or shape, for example due to variations in clamping radius resulting from clamping the flat portion of the wafer instead of the round portion of the wafer.

While such clamp ring is useful to mitigate the problem of cooling gas leakage from the backside of the wafer and the pedestal for many applications, it is not well adapted for applications where the exposed metallic fingers are likely to react with process chemicals, for example as encountered during plasma etching. The clamp ring is therefore limited to nonvolatile processes involving reactants, or gases that cannot either damage the clamp ring, for example by etching or deposition; or interact with the materials of the clamp ring to produce byproducts that can poison the process. Another concern is that it is more difficult to manufacture a clamp ring having a circumferential array of radially projecting fingers than a clamping ring having a continuous flat clamping surface.

It would therefore be useful to improve the art of wafer clamping to secure wafers having a flat portion to a wafer pedestal such that cooling gases cannot leak from between the backside of the wafer and the wafer pedestal during wafer processing in all processing environments and under all processing conditions.

SUMMARY OF THE INVENTION

The invention is a compound clamp ring having a substantially annular configuration defining an open inner area, as determined by the inner diameter of the clamp ring, to allow processing gases, etc. to reach the surface of the wafer to be processed. The clamp ring has a shape and thickness that is adapted to coincide with the round portion of a semiconductor wafer edge and, when clamping the wafer to a wafer pedestal, to press the round portion of the wafer edge into sealing abutment with the wafer pedestal.

The clamp ring also defines a cavity that is adapted to securely receive and enclose a comb-like array of resilient flexures that extend toward and overlap the region of the wafer flat. The flexures are slightly bent such that they are pre-biased to press the flat portion of the wafer into sealing engagement with the wafer pedestal. Because the cavity surrounds and encloses the flexures during wafer processing, the flexures are not exposed to the process environment and they may therefore be made of any material exhibiting the amount of resilience necessary to complete the seal between the wafer flat portion and the pedestal. The clamp ring itself is readily manufactured from ceramic materials or any other process compatible materials.

The clamp ring exerts an even and continuous pressure about the entire edge of a wafer having a flat portion to establish and maintain a reliable and continuous seal at the wafer edge by providing both a solid clamp surface at the round portion of the wafer, and by providing a resilient clamp surface adapted to conform the wafer to the pedestal topography at the flat portion of the wafer. The invention provides a clamp ring with which coolant gas leakage from the wafer backside is reduced or eliminated, while also allowing the clamp ring to be made from materials that are process compatible for most or all process environments, such as etching, deposition, etc.

BRIEF DESCRIPTION OF THE DRAWINGS

FIG. 3b is a side elevation view showing a cross section of a wafer clamp and wafer pedestal taken along line A—A in FIG. 3a;

FIG. 4b is a side elevation view showing a cross section of the wafer clamp ring according to the invention taken along line B—B in FIG. 4a;

FIG. 4c is a side elevation view showing a cross section of the wafer clamp ring according to the invention taken along line C—C in FIG. 4a;

DETAILED DESCRIPTION OF THE INVENTION

The invention is a compound clamp ring that is useful for pressing the edges of a semiconductor wafer having a flat portion into sealing abutment with wafer pedestal to inhibit or prevent the escape of cooling gases from the wafer backside into the process environment during wafer processing. The clamp ring provides a continuous and reliable seal while avoiding the need to use an elastomeric seal or other process sensitive sealing means. The clamp ring disclosed herein also provides excellent pressure performance and cooling gas sealing when used with round wafers, as well as with wafers having a flat portion. Wafer clamping is accomplished in the clamp ring with a first clamp surface that is discontinuous and a second clamp surface that is located within the discontinuity. The second clamp surface extends along a linear axis positioned as a secant of the circle defined by the first clamp surface.

Figure 1:
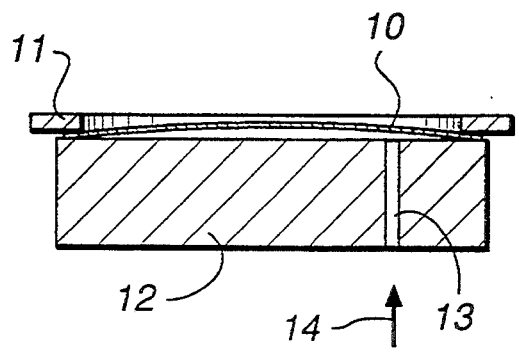
FIG. 1 is a sectioned side elevation view showing a semiconductor wafer secured to a wafer pedestal by a prior art wafer clamp ring.
Figure 2:
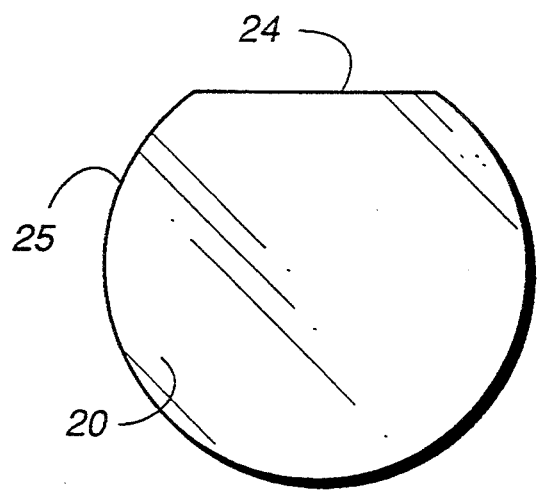
FIG. 2 is a top plan view showing the profile of a typical semiconductor wafer having a wafer flat portion.
Figure 3A:
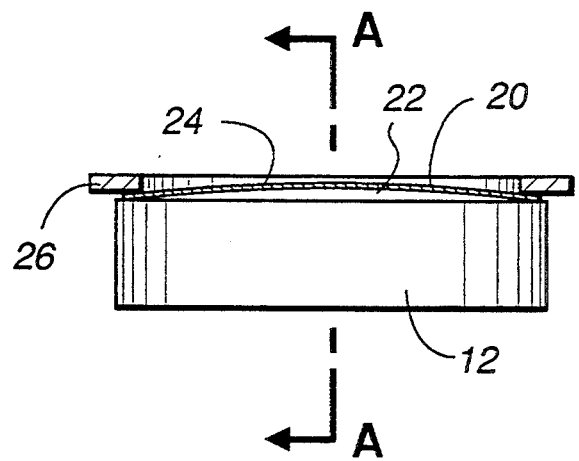
FIG. 3a is a side elevation view showing an exposed flat portion of a semiconductor wafer when the wafer is secured to a wafer pedestal by a prior art wafer clamp ring.
Figure 3B:
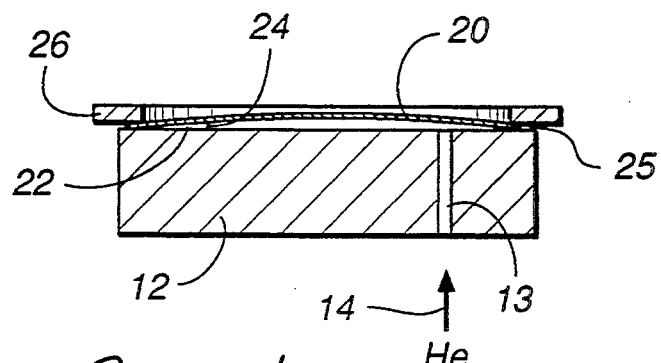
Figure 4A:
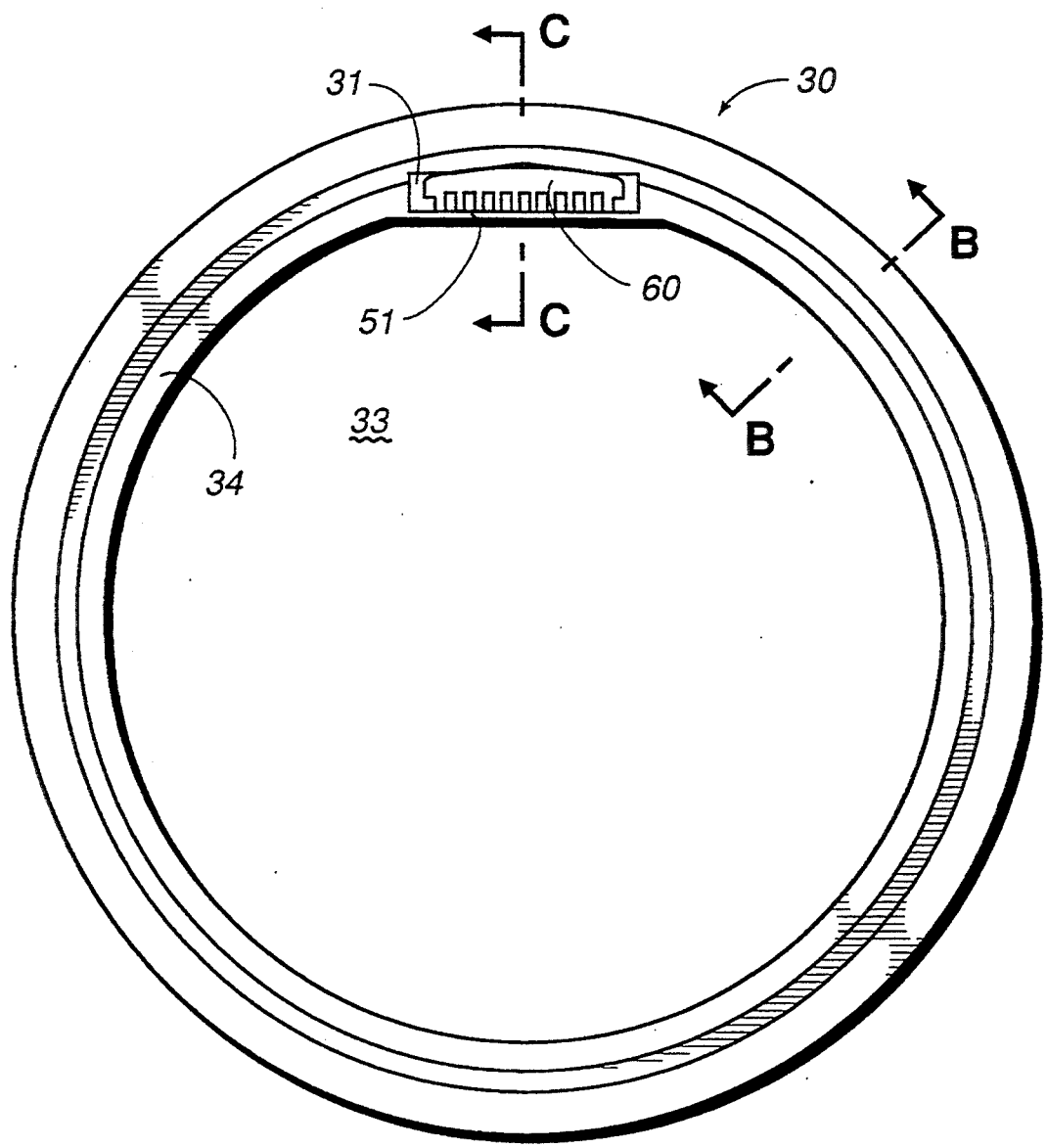
FIG. 4a is a bottom plan view of a wafer clamp ring according to the invention.

FIG. 4a is a bottom plan view of a compound wafer clamp ring according to the invention. The compound clamp ring 30 has a substantially annular configuration that defines an open inner area 33, as determined by the inner diameter of the clamp ring. The open inner area 33 allows processing gases, etc. to reach the surface of the wafer during wafer processing. The clamp ring 30 defines a clamping surface 34 that coincides with the round portion 25 of a semiconductor wafer edge (see FIG. 2) and that, when clamping the wafer 20 to a wafer pedestal, presses the round portion 25 of the wafer edge into sealing abutment with the wafer pedestal.

The clamp ring also defines a cavity 31 that is adapted to receive securely and to enclose a comb-like array of resilient flexures 60 (discussed below in connection with FIGS. 5 and 6) that extend toward and overlap the region of the wafer flat. The cavity in the exemplary embodiment of the invention is 2.5-inches (63.5-mm)

long and 0.5-inches (12-mm) wide. While the cavity need only be wide enough to provide an attachment point for securing the flexure array and for accommodating the flexures lengthwise, the cavity should be long enough to accept a flexure array that can contact the entire flat portion of the wafer. The cavity should be deep enough to enclose the flexure array (this is discussed in greater detail below in connection with FIG. 4c).

The clamp ring can be made in any of various sizes for use with wafers of any standard and/or nonstandard size. For example, the exemplary clamp ring is useful to secure 8-inch (200-mm) wafers during processing. In most applications of the clamp ring, the clamp ring inner diameter should be chosen to allow a maximum amount of wafer surface area possible to be exposed to the process environment, such that a maximum number of devices can be fabricated per wafer. When used for 8-inch wafers, the clamp ring has an inner diameter that is preferably about 7.6-inches (194-mm).

The outer diameter of the wafer is chosen to produce a clamp ring that is strong and rigid, and that can withstand repeated clamping operations without failing due to fatigue. In the exemplary embodiment of the invention, the clamp ring has an outer diameter of 9.1-inches (231.5-mm).

The clamp ring is manufactured, for example by machining, casting, etc., using any process compatible material, such as any of various ceramic materials. For example, in the exemplary embodiment of the invention the clamp ring is made from an alumina material, such as Coors 99.5 made by LTD Ceramics, Menlo Park, Calif. It has been found that such material is widely process compatible, i.e. it does not etch, it is easy to clean. When selecting the clamp ring material it is important to consider the process environment in which the clamp ring is used, i.e. the material should be both process compatible and resistant to the harsh conditions found within the process environment; the ease with which the material may be cleaned, e.g. the rate at which deposits build up on the clamp ring surface in a CVD or PVD chamber; and the physical, thermal, and chemical stability of the material, i.e. it is preferred to use a durable material that has a low thermal coefficient of expansion and that does not produce particles which may be a source of chamber and wafer contamination.

Figure 4B:
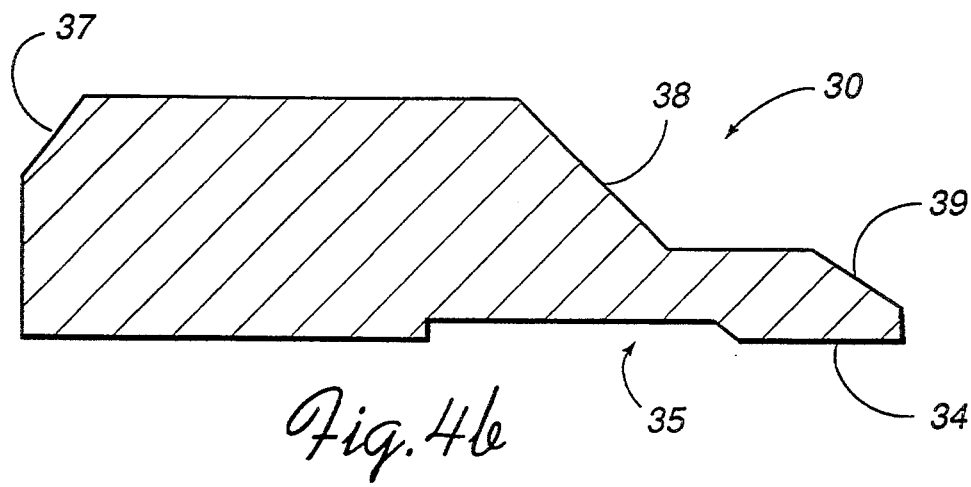

FIG. 4b is a side elevation view showing a cross section of the wafer clamp ring 30 according to the invention taken along line B—B in FIG. 4a. The figure shows the wafer clamping surface 34 that contacts the round portion of the wafer. The clamping surface 34 of the clamp ring should be extremely smooth. A channel or groove 35 formed in the clamp ring is provided to reduce the fine polished area of the surface 34 to about 4 mm to 5 mm of radial extension. Using a smaller clamping surface reduces the amount of machining and polishing necessary to finish the clamping surface. The groove 35 separates the fine polished area of the clamp ring from the rest of the clamp ring.

The profile of the clamp ring is shown in the figure for purposes of illustration only. The clamp ring may be fashioned with any profile that suits the application to which the clamp ring is put. For example, sloping portions 37, 38, and 39 need not slope as shown, although it is generally preferred that the clamp ring have smooth transitional surfaces to avoid the possibility of trapping particles, or of encouraging the formation of deposits, either of which could be a source of chamber and/or wafer contamination. Furthermore, it is preferred to provide a tapered clamp ring profile that does not shadow the wafer during wafer processing.

Figure 4C:
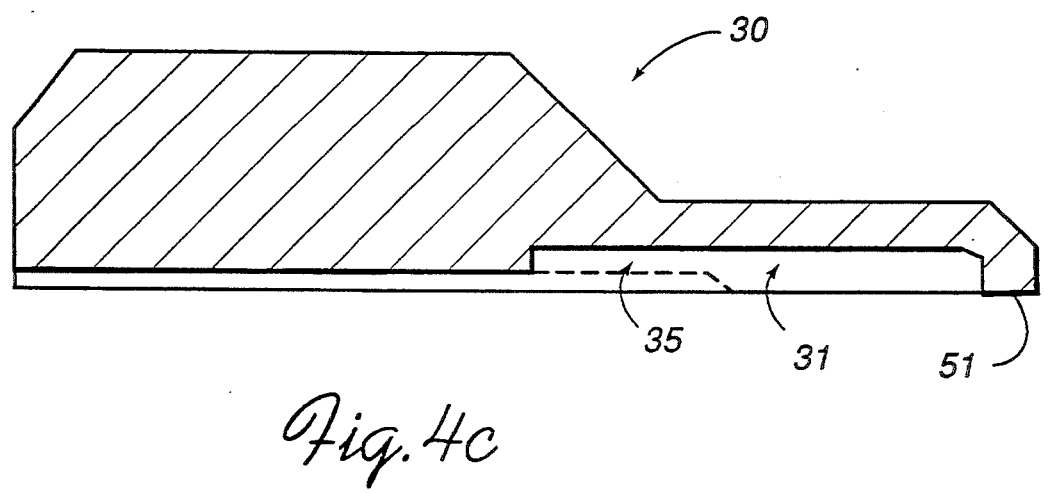

FIG. 4c is a side elevation view showing a cross section of the wafer clamp ring according to the invention taken along line C—C in FIG. 4a. The figure shows the channel 35 (which is also shown in FIG. 4b) as a dashed line. The clamp ring cavity 31 is also shown in the figure, as well as a clamp ring secondary seal surface 51. The cavity and the secondary seal surface cooperate to enclose the flexure array during wafer processing, such the flexures are not exposed to the process environment. This feature of the invention is discussed in greater detail below.

The cavity 31 in the exemplary embodiment of the invention has a depth of 0.032-inches (0.813-mm) which is sufficient to accommodate the flexure array and also allow some flexion of the flexures during wafer clamping. The secondary seal surface 51 in the exemplary embodiment of the invention provides a wafer contact surface having a width of 0.04-inches (1.0-mm).

Figure 5:
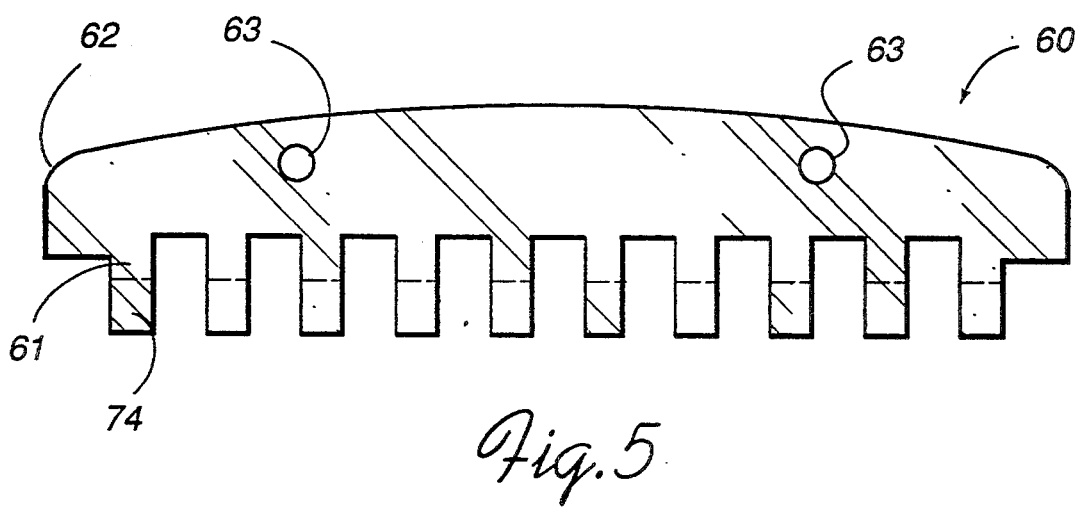
FIG. 5 is a top plan view of a comb-like array of resilient flexures that are adapted to press a wafer flat portion into sealing abutment with a wafer pedestal according to the invention.

FIG. 5 is a top plan view of a comb-like array 60 of resilient flexures 61 that are adapted to press the wafer flat portion into sealing abutment with a wafer pedestal according to the invention. The flexures 61 have a slightly bent portion 74 (also see FIG. 6), such that they are pre-biased to conform to and to press the flat portion of the wafer into sealing engagement with the wafer pedestal. Because the clamp ring cavity 31 surrounds and encloses the flexures 61 during wafer processing, the flexures are not exposed to the process environment and they may therefore be made of any material exhibiting the amount of resilience necessary to bias the wafer flat portion into abutment with the pedestal and complete the seal between the wafer flat portion and the pedestal. The comb-like flexure array also includes two holes 63 that are used both to locate the array and to secure the array to the clamp ring.

In the exemplary embodiment of the invention, the flexures are made from a springy material, such as 7075 tempered aluminum, although any other resilient material may be used. The flexures are typically spaced apart by about 0.016-inches (0.4-mm). The actual length, width, thickness, and spacing of the flexures, as well as the actual number of flexures provided is a function of wafer size, the application to which the clamp ring is put, etc. For example, the flexures should be long enough to contact the flat portion of the wafer, and they should be wide enough to provide even and continuous coverage of the wafer surface. The flexure array may be manufactured by machining, stamping, or by any other known method.

One advantage of using the metal flexures is that they are able to conduct any charge that may build up on the wafer surface from the wafer to the pedestal. For example, it is known that a negative charge can build up on the wafer back surface due to the presence of an RF plasma within the process environment. A ceramic clamp ring is nonconductive and therefore cannot conduct the charge away from the wafer surface to the pedestal.

The build up of a charge on the wafer surface is a serious problem because such charge is opposite in polarity from the charge that is present on the surface of the pedestal. The wafer sticks to the pedestal as a result of the two oppositely charged bodies, the wafer and the pedestal, being in intimate contact with each other. Removing a wafer that is stuck to the pedestal is time consuming and often damages or breaks the wafer. If the wafer is broken in the chamber, the chamber must be opened and cleaned. Accordingly, the clamp ring also helps to prevent the wafer from sticking to the pedestal.

Figure 6:
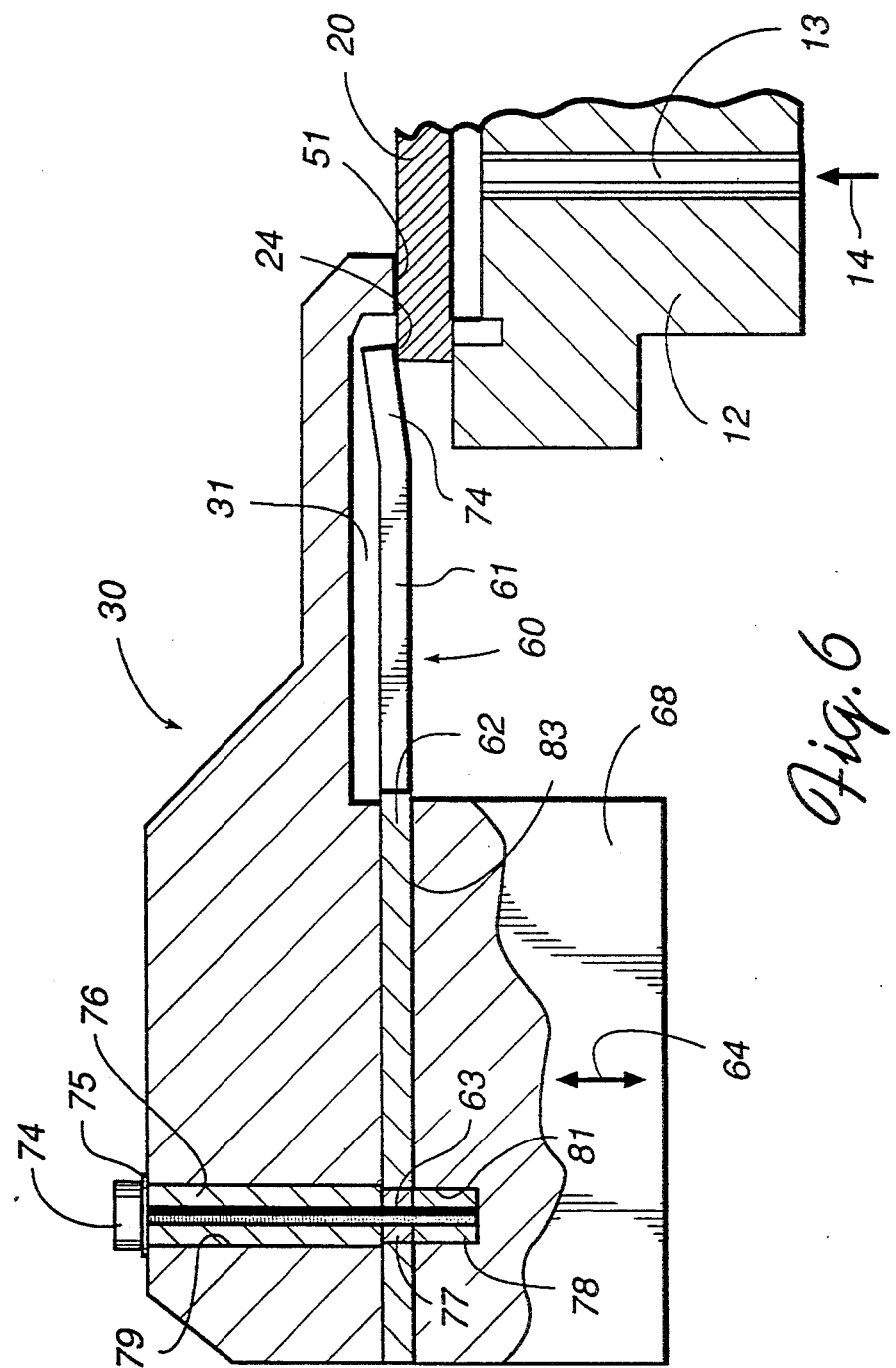
FIG. 6 is a partially sectioned side elevation view of a compound wafer clamp ring as used to secure the flat portion of a semiconductor wafer to a wafer pedestal according to the invention.

FIG. 6 is a partially sectioned side elevation view of a compound wafer clamp ring as used to secure the flat portion of a semiconductor wafer to a wafer pedestal according to the invention. In the figure, the clamp ring 30 is shown mounted to a clamping mechanism carrier 68 with a bolt 74 and washer 75. Accordingly, the clamp 30 and carrier 68 have appropriate holes (79 and 81, respectively) drilled therein to receive the bolt 74. The clamping mechanism is operable to raise and lower the clamp, as shown by the arrow 64, to secure the wafer during processing when the clamp is lowered, and to allow the wafer to be removed when the clamp is raised.

The flexure array 60 is retained in place in a slot 83 at a body portion 62 of the array by compression of the clamp ring 30 and the carrier 68 when the bolt 74 is tightened. The flexure array accordingly has at least one hole 63 drilled therethrough and is provided with a locating bushing 77. Bushings (76 and 78) are placed within the clamp ring and clamping mechanism holes to assure proper positioning of a flexure array 60 relative thereto.

The clamp ring cavity 31 is adapted to receive and enclose the comb-like array 60 of resilient flexures 61 during wafer processing. The cavity 31 should provide sufficient clearance to allow displacement and flexion of the flexures 61 during wafer clamping.

The flexure array has several independent compliant flexures 61 that provide continuous contact with the wafer 20 at the wafer flat portion 24. The flexures include a bent portion 74 that is pre-biased into conformance with the profile of the wafer at the wafer flat. The flexures deform during wafer clamping to urge the wafer into sealed engagement with the wafer pedestal 12. The front portion of the clamp ring 51 touches or nearly touches the wafer and thereby encloses the flexure assembly to shield it from exposure to the process environment.

Figure 7:
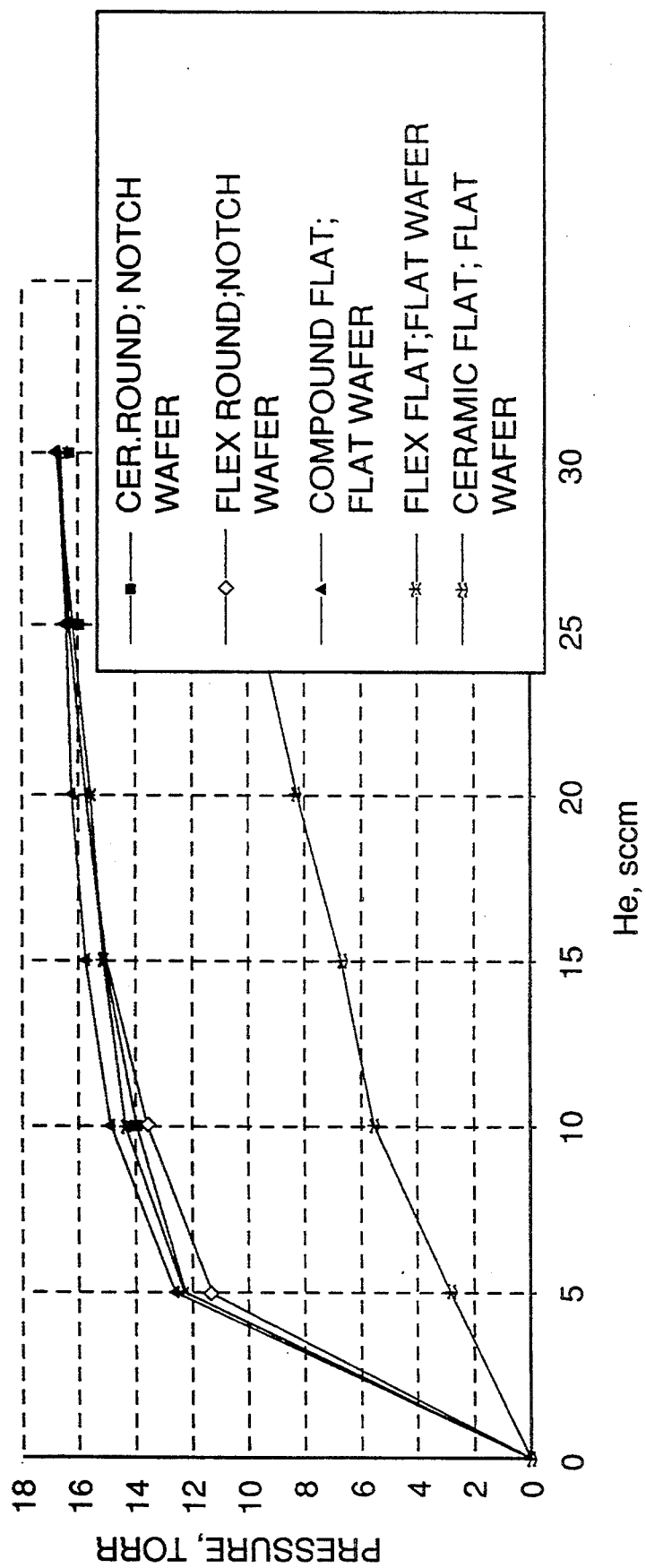
FIG. 7 is a graph showing cooling gas leakage profiles for prior art wafer clamps and for a compound wafer clamp according to the invention.

FIG. 7 is a graph showing cooling gas leakage profiles for prior art wafer clamps and for a compound wafer clamp according to the invention. In the figure, wafer backside pressure in Torr is plotted against the supply rate of cooling gas in standard cubic centimeters per minute ("SCCM") to show the relative effectiveness of various clamp rings when sealing the edge of the wafer to the wafer pedestal. A higher pressure value plotted across the graph for various gas flow rates indicates a better seal. Thus, an unacceptable seal is shown by the curve plotted for a flat ceramic clamp ring when used to clamp a wafer having a wafer flat; while a good seal is provided by the compound wafer of the invention when used to clamp a wafer having a wafer flat. The pressure values for prior art ceramic and flexible clamps when used to clamp round wafers are shown for purposes of comparison. The pressure value for a flexible clamp, when used to clamp a wafer having a flat portion is also shown. However, as pointed out above, flexible clamps which also perform well are process sensitive and expensive to manufacture, and are therefore do not have as broad an application as the present invention.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

We claim:

1. A compound clamp ring for applying even and continuous pressure to an edge of a semiconductor wafer, including semiconductor wafers defining an edge having a round edge portion and a discontinuous flat edge portion, to sealingly engage the wafer edge with a wafer pedestal, comprising:

a discontinuous first clamp surface having a substantially annular configuration adapted to contact and apply pressure to the round portion of the wafer edge;

a second, resilient clamp surface which extends along a linear axis positioned as a secant of a circle defined by said first clamp surface;

a cavity defined by said clamp ring and located generally adjacent to said second clamp surface; and a comb-like array of spaced resilient flexures secured to said clamp ring within said cavity; said comb-like array being substantially enclosed by said cavity at said second surface and adapted to conform to and apply pressure to the discontinuous portion of the wafer edge, wherein said second clamp surface is located within said discontinuity, said flexures including a bent portion adapted to engage with and urge said wafer discontinuous edge portion into sealing abutment with said wafer pedestal;

wherein said clamp ring applies pressure to all edges of the wafer to complete a continuous seal between the wafer and said pedestal and minimize leakage of a coolant fluid from a wafer backside into a wafer process environment.

2. The clamp ring of claim 1, further comprising:

a secondary seal surface provided adjacent to the position assumed by said wafer discontinuous edge portion to enclose said clamp ring cavity during wafer clamping.

3. A compound clamp ring for applying even and continuous pressure to a semiconductor wafer edge having a round edge portion and a flat edge portion to sealingly engage said wafer edge with a wafer pedestal, comprising:

a first clamp surface having a substantially annular configuration adapted to contact and apply pressure to the round portion of said wafer edge;

said clamp ring defining a cavity that coincides with said wafer flat edge portion; and a comb-like array of spaced, elongated resilient flexures adapted to conform to and to apply pressure to said flat portion of said wafer edge, said flexures being secured to said clamp ring within said cavity and being enclosed thereby;

wherein said clamp ring applies pressure to all edges of said wafer to complete a continuous seal between said wafer and said pedestal and minimize leakage of a coolant fluid from a wafer backside into a wafer process environment.

4. The clamp ring of claim 3, wherein said flexures include a bent portion adapted to engage with and urge said wafer flat edge portion into sealing abutment with said wafer pedestal.

5. The clamp ring of claim 3, wherein said clamp ring is made of a ceramic material.

6. The clamp ring of claim 3, wherein said clamp ring is made of alumina.

7. The clamp ring of claim 3, wherein said comb-like array of flexures is made of tempered aluminum.

8. A method for applying even and continuous pressure to a semiconductor wafer edge having a round edge portion and a flat edge portion to sealingly engage said wafer edge with a wafer pedestal, comprising the steps of:

contacting and applying pressure to the round portion of said wafer edge with a first clamp surface having a substantially annular configuration; and applying pressure to said flat portion of said wafer edge with a comb-like array of resilient flexures adapted to conform to said flat portion of said wafer, said flexures being secured to said clamp ring within a cavity defined thereby and being enclosed within said cavity;

wherein said clamp ring applies pressure to all edges of said wafer to complete a continuous seal between said wafer and said pedestal and minimize leakage of a coolant fluid from a wafer backside into a wafer process environment.

* * * * *